: US 11,502,681 B2
(45) Date of Patent: Nov. 15, 2022

(12) United States Patent
Ucar et al.

(54) METHOD AND SYSTEM FOR BALANCING POWER-SUPPLY LOADING

(71) Applicant: Rambus Inc., San Jose, CA (US)

(72) Inventors: Talip Ucar, San Jose, CA (US); Frederick A. Ware, Los Altos Hills, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/296,575

(22) PCT Filed: Nov. 27, 2019

(86) PCT No.: PCT/US2019/063807
§ 371 (c)(1),
(2) Date: May 25, 2021

(87) PCT Pub. No.: WO2020/117604
PCT Pub. Date: Jun. 11, 2020

(65) Prior Publication Data
US 2021/0399727 A1 Dec. 23, 2021

Related U.S. Application Data

(60) Provisional application No. 62/775,285, filed on Dec. 4, 2018.

(51) Int. Cl.
H03K 17/56 (2006.01)
G06F 1/10 (2006.01)
H03F 3/04 (2006.01)

(52) U.S. Cl.
CPC ............... H03K 17/56 (2013.01); G06F 1/10 (2013.01); H03F 3/04 (2013.01)

(58) Field of Classification Search
CPC .... H03K 17/56; H03K 19/00384; G06F 1/10; H03F 3/04
See application file for complete search history.

(56) References Cited

U.S. PATENT DOCUMENTS 4,980,582 A 12/1990 Waller et al.
5,974,259 A 10/1999 Casal et al.
(Continued)

OTHER PUBLICATIONS

Notification of Transmittal of the International Search Report and the Written Opinion of the International Searching Authority, or the Declaration with dated Feb. 4, 2020 re: Int'l Appln. No. PCT/US2019/063807. 10 Pages.
(Continued)

Primary Examiner — Metasebia T Retebo
(74) Attorney, Agent, or Firm — Silicon Edge Law Group LLP; Arthur J. Behiel

(57) ABSTRACT

A transmitter merges even and odd data streams to drive a serialized signal. Identical even and odd drivers take turns driving symbols from respective even and odd streams using respective pull-up transistors and pull-down transistors. Each transistor exhibits a significant source-gate capacitance that is charged when the transistor is turned on to drive the serialized signal. Charging one of these capacitances loads the power supply and thus introduces noise. Each even and odd driver includes a pre-driver that times the charging of a source-gate capacitance in the active driver to the discharge of a source-gate capacitance in the inactive driver. The discharge of the source-gate capacitance in the inactive driver counters the effect of charging the active driver, providing much of the power required by the active driver and thus reducing supply noise.

22 Claims, 4 Drawing Sheets

(56) References Cited

U.S. PATENT DOCUMENTS

| | | | |
|---|---|---|---|
| 6,054,874 A | 4/2000 | Sculley et al. | |
| 6,154,083 A | 11/2000 | Gaudet et al. | |
| 6,380,797 B1 | 4/2002 | MacaluSo et al. | |
| 6,433,605 B1 | 8/2002 | Zhang | |
| 6,529,229 B2 | 3/2003 | Nagumo | |
| 6,618,277 B2 | 9/2003 | Gauthier et al. | |
| 6,690,196 B1 | 2/2004 | Cecchi et al. | |
| 7,095,348 B1 | 8/2006 | Sutardja et al. | |
| 7,269,212 B1 | 9/2007 | Chau | |
| 7,280,060 B1 | 10/2007 | Sutardja et al. | |
| 7,433,665 B1 | 10/2008 | Roo | |
| 7,755,381 B1 | 7/2010 | Alfke et al. | |
| 8,143,911 B2 | 3/2012 | Wu et al. | |
| 8,314,633 B2 | 11/2012 | Gupta et al. | |
| 8,443,223 B2 | 5/2013 | Abbasfar | |
| 8,446,173 B1 | 5/2013 | Faucher et al. | |
| 8,451,913 B2 | 5/2013 | Oh et al. | |
| 8,520,348 B2 * | 8/2013 | Dong | G06F 13/4086 326/30 |
| 9,310,830 B2 | 4/2016 | Fiedler | |
| 9,484,891 B2 | 11/2016 | Amirkhany et al. | |
| 9,552,894 B2 | 1/2017 | Jeong | |
| 9,835,655 B2 | 12/2017 | Ozawa | |
| 2007/0011640 A1 | 1/2007 | Hirata | |
| 2008/0198961 A1 | 8/2008 | Collins et al. | |
| 2017/0019095 A1 * | 1/2017 | Leong | H02M 1/34 |

OTHER PUBLICATIONS

Shinyoung Park, advisor Prof Joungho Kim, "A Novel Active Ground Bounce Reduction Method and its Applications in High-Bandwidth Memory (HBM)", TeraByte Interconnection and Package Laboratory School of Electrical Engineering KAIST. 26 pages.

William J. Dally et al., Digital Systems Engineering, Published by the Press Syndicate of the University of Cambridge, The Pitt Building, Trumpington Street, Cambridge, United kingdom. 1998, pp. 537-544. 10 pages.

* cited by examiner

METHOD AND SYSTEM FOR BALANCING POWER-SUPPLY LOADING

BACKGROUND

Transmitters and receivers in typical high-speed digital communication systems convey information as series of symbols. Common binary systems express a logic one symbol value by drawing a first current from a supply-voltage node through a load to produce a voltage representative of a logic one, and a logic zero symbol value by drawing a second current through the load to produce a voltage representative of a logic zero. A receiver then samples the symbols against a reference voltage to recover the original information.

Power supplies are imperfect. For example, the lines and pads used to convey supply current exhibit parasitic resistive, inductive, and capacitive impedances. Unfortunately, these impedances and the data-dependent supply current together cause the supply voltage to fluctuate, which can introduce errors and reduce speed performance. Efforts to minimize supply fluctuations have focused on improved voltage regulation and reduced supply impedance so the supply better tolerates changes in load current, and the use of balanced symbols patterns or compensation currents to minimize such changes. These efforts have met with considerable success but there is ever a demand for improved performance.

BRIEF DESCRIPTION OF THE DRAWINGS

The detailed description is illustrated by way of example, and not by way of limitation, in the figures of the accompanying drawings and in which like reference numerals refer to similar elements and in which.

DETAILED DESCRIPTION

A transmitter merges data symbols from alternative drivers in a manner that reduces power-supply fluctuations and concomitant noise. Each driver includes transistors with parasitic capacitances that are charged when the driver is actively driving a symbol and discharged when the driver is inactivated in preparation for a subsequent symbol. Predrivers synchronize the charge timing of the capacitance in the active driver with the discharge timing of the capacitance in the inactive driver. The discharge current from the inactive driver to the power supply matches the coincident charge current to the active driver from the power supply. Supply current during symbol transitions is thus reduced and supply-voltage fluctuations minimized.

Figure 1:
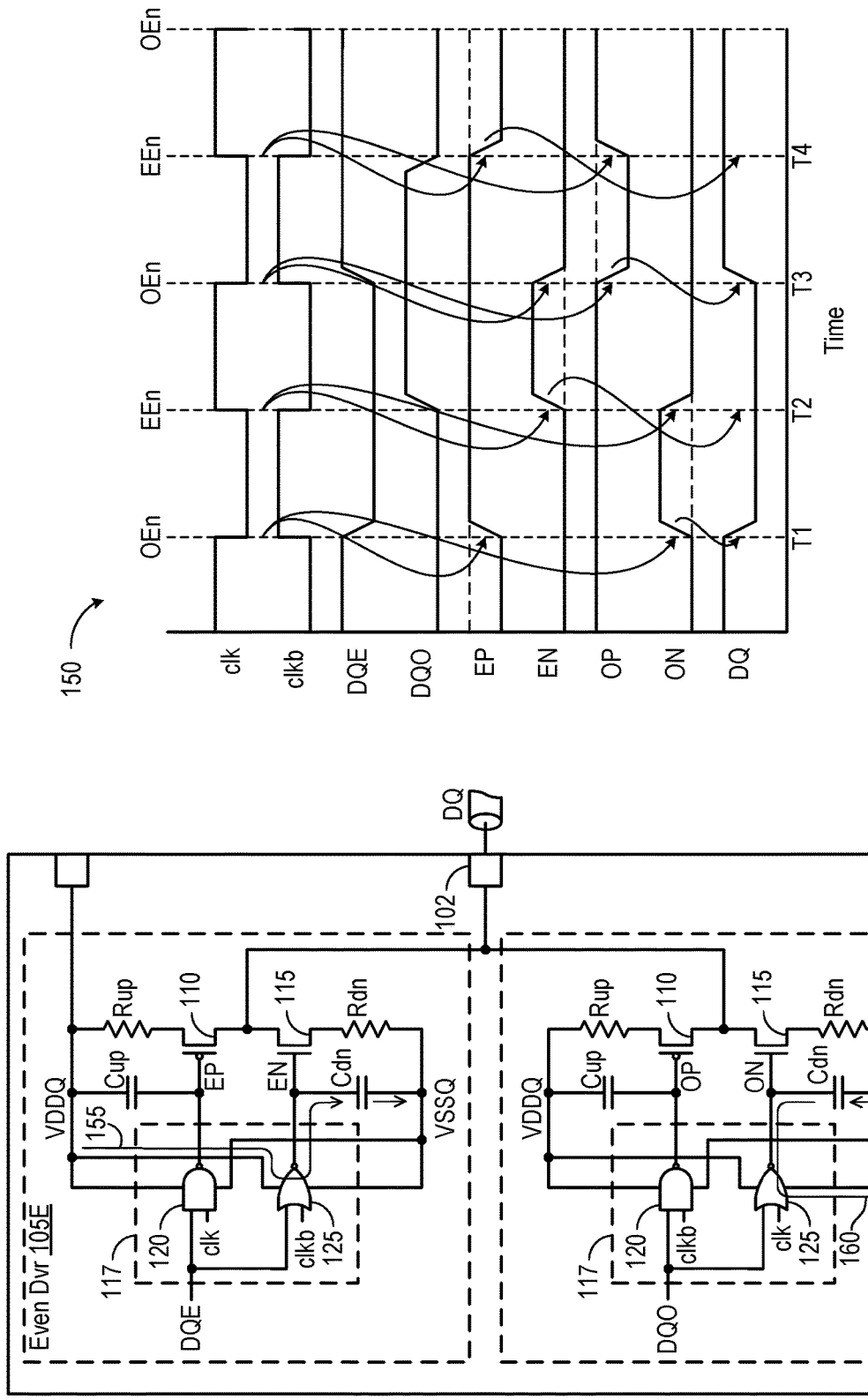
FIG. 1 depicts a transmitter 100 that merges even and odd data streams DQE and DQO to drive a serialized signal DQ on a pad 102 that serves as an output node, and additionally depicts a waveform diagram 150 illustrating the working of transmitter 100.

FIG. 1 depicts a transmitter 100 that merges even and odd data streams DQE and DQO to drive a serialized signal DQ on a pad 102 that serves as an output node. Identical even and odd drivers 105E and 105O take turns driving symbols from respective even and odd streams DQE and DQO using respective pull-up transistors 110 and pull-down transistors 115 to connect pad 102 to a high supply node VDDQ or a low supply node VSSQ via respective source impedances Rup and Rdn. Each drive transistor 110 (115) exhibits a significant source-gate capacitance Cup (Cdn) that is charged when the transistor is turned on to drive signal DQ high (low). Charging either of parasitic capacitances Cup or Cdn draws a supply current that tends to draw down the supply voltage and thus introduce noise. Each driver 105E and 105O includes a pre-driver 117 that times the charging of a source-gate capacitance in the active driver to the discharge of a source-gate capacitance in the inactive driver. The discharge of the source-gate capacitance in the inactive driver counters the effect of charging the active driver, thereby providing much of the power required by the active driver and reducing supply noise.

Pre-drivers 117 include a NAND gate 120 and a NOR gate 125. In even driver 105E, NAND gate 120 is driven by even data DQE and a clock signal clk, and NOR gate 120 by even data DQE and a complementary clock signal clkb. In odd driver 105O, NAND gate 120 is driven by odd data DQO and a clock signal clkb, and NOR gate 120 by odd data DQO and clock signal clk. With this arrangement, each driver 105E and 105O, when active, charges just one of its capacitances Cup and Cdn and holds that charge to be discharged in time with the activation of the alternate driver.

FIG. 1 includes a timing diagram 150 illustrating the operation of transmitter 100. Complementary timing signals clock clk and clock-bar clkb transition simultaneously at times T1-T4. Odd times T1 and T3 are labeled OEn for "odd enable" and even times T2 and T4 are labeled EEn for "even enable." Considering first odd-enable time T1 and odd driver 105O, low and high timing signals clk and clkb allow NAND gate 120 and NOR gate 125 to pass an inverted sense of odd data DQO to nodes OP and ON, the gates of respective transistors 110 and 115. Odd data DQO is low at time T1 so signal OP remains high and signal ON transitions high. Raising the voltage on signal ON charges capacitance Cdn and turns on pull-down transistor 115, and consequently pulls output signal DQ low through transistor 115 and related source impedance Rdn. Node ON remains high, and capacitance Cdn charged, until time T2.

Even driver 105E is enabled at time T2. High and low timing signals clk and clkb allow NAND gate 120 and NOR gate 125 to pass an inverted sense of even data DQE to nodes EP and EN, the gates of respective transistors 110 and 115. Even data DQE is low at time T2 so signal EP remains high and signal EN transitions high. Raising the voltage on signal EN charges capacitance Cdn and turns on pull-down transistor 115, and consequently retains output signal DQ low. The charge path for capacitance Cdn in even driver 105E is illustrated using an arrow 155. Also at time T2, high and low timing signals clk and clkb control odd driver 105O to discharge capacitance Cdn, driving node ON back to VSSQ at the same time even driver 105E is charging its capacitance Cdn. The discharge path for capacitance Cdn in odd driver 105O is illustrated using an arrow 160. Capacitances Cup and Cdn are approximately equal within and between drivers 105E and 105O. The simultaneous charge and discharge currents 155 and 160 offset one another to reduce regional supply-current fluctuations and concomitant supply noise.

Timing diagram 150 illustrates that each time odd driver 105O is enabled (i.e., at each time OEn) one of signals OP and ON transitions to charge a respective capacitance Cup and Cdn and one of signals EP and EN in even driver 105E transitions to discharge a respective capacitance Cup and Cdn. Likewise, each time even driver 105E is enabled (i.e., at each time EEn) one of signals EP and EN transitions to charge a respective capacitance Cup and Cdn and one of signals OP and ON in odd driver 105O transitions to discharge a respective capacitance Cup and Cdn. The simultaneous charge and discharge of similarly sized capacitances reduces the net local supply current and thus reduces supply noise.

Transistors 110 and 115 are insulated-gate field-effect transistors (IGFETs), each with first and second current-handling terminals—a source and a drain—coupled respectively to a supply node and output node 102, and a control terminal—a gate—coupled to a respective output of one of pre-drivers 117. Different types of switching elements with differently name current-handling and control terminals can be used in other embodiments.

Figure 2:
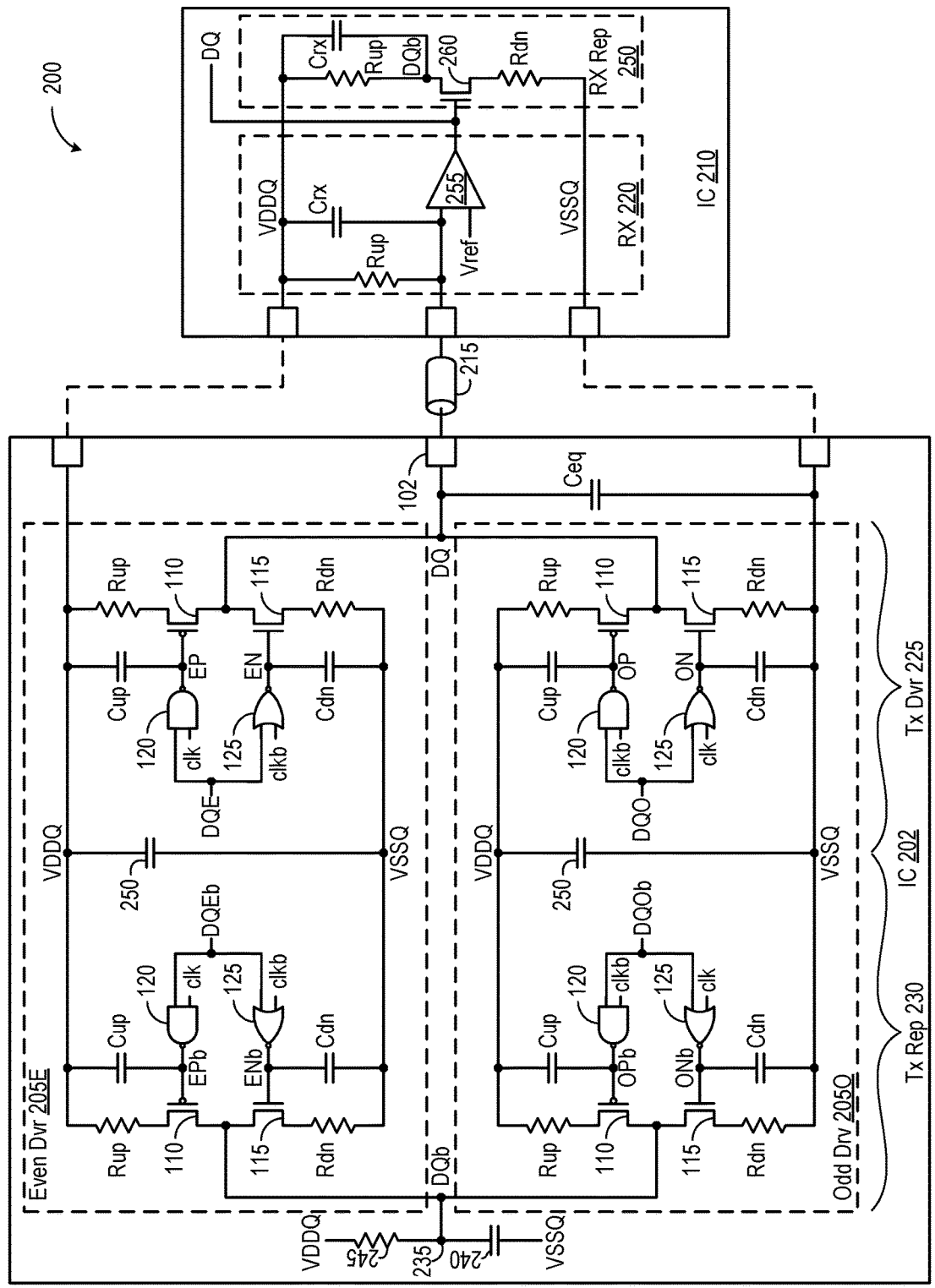
FIG. 2 depicts a communication system 200 in which a replica transmitter 230 and replica receiver 250 reduce supply noise.

FIG. 2 depicts a communication system 200 in accordance with another embodiment. System 200 includes a first integrated circuit (IC) 202 with odd and even drivers 205E and 205O that are like drivers 105E and 105O of FIG. 1, with like-identified elements being the same or similar. IC 202 is coupled to a second IC 210 via a communication channel 215 that conveys a data signal DQ to a receiver 220. Replica circuits on both IC 202 and IC 210 draw compensatory currents that even out supply fluctuations that attend data transitions, and thus further reduce supply noise.

IC 202 is divisible into two symmetrical halves, a transmit driver 225 and a transmit replica 230. Transmit driver 225 is a serializer that operates in the manner detailed above in connection with FIG. 1 to serialize even and odd data signals DQE and DQO on pad 102. A capacitance Ceq illustrates the equivalent capacitance of channel 215 and receiver 210. Transmit replica 230 is identical to transmit driver 225 but is provided with complementary even and odd data signals DQEb and DQOb to drive a replica node 235 that is provided with a capacitance 240 matched to equivalent capacitance Ceq and a pull-up resistor 245 matched to the pull-up resistance Rup at receiver 220. Decoupling capacitances 250 are provided between supply terminals VDDQ and VSSQ.

Transmitter replica 230 has an even portion and an odd portion. The even portion, in even driver 205E, drives replica node 235 in the direction opposite pad 102 and under a replica load. Consequently, one of transistors 110 and one of transistors 115 are biased on when even driver 205E is active. Likewise, for odd driver 205O, one of transistors 110 and one of transistors 115 are on when odd driver 205O is active. Supply current between nodes VDDQ and VDDS at IC 210 thus remains relatively constant in the face of changing data values and patterns.

IC 210 includes a receiver replica 250 that mirrors receiver 220 to smooth supply current. (Dashed supply connections between ICs 202 and 210 illustrate that supply nodes VDDQ and VDDS can be from the same or different power supplies.) Receiver 210 includes an amplifier 255 with one input node coupled to supply node VDDQ via a pull-up resistor Rup and capacitance Crx—collectively a first impedance—and another input coupled to a reference level Vref. Amplifier 255 conveys data signal DQ toward some core circuitry (not shown) that is the recipient of that data, a memory core for example. Amplifier 255 also sends signal DQ to receiver replica 250. Replica 250 has a transistor 260 that inverts signal DQ and drives the resulting signal DQb into a second impedance that is matched to the input of amplifier 255. Supply current between nodes VDDQ and VDDS at IC 210 thus remains relatively constant responsive to changing data values and patterns.

Figure 3:
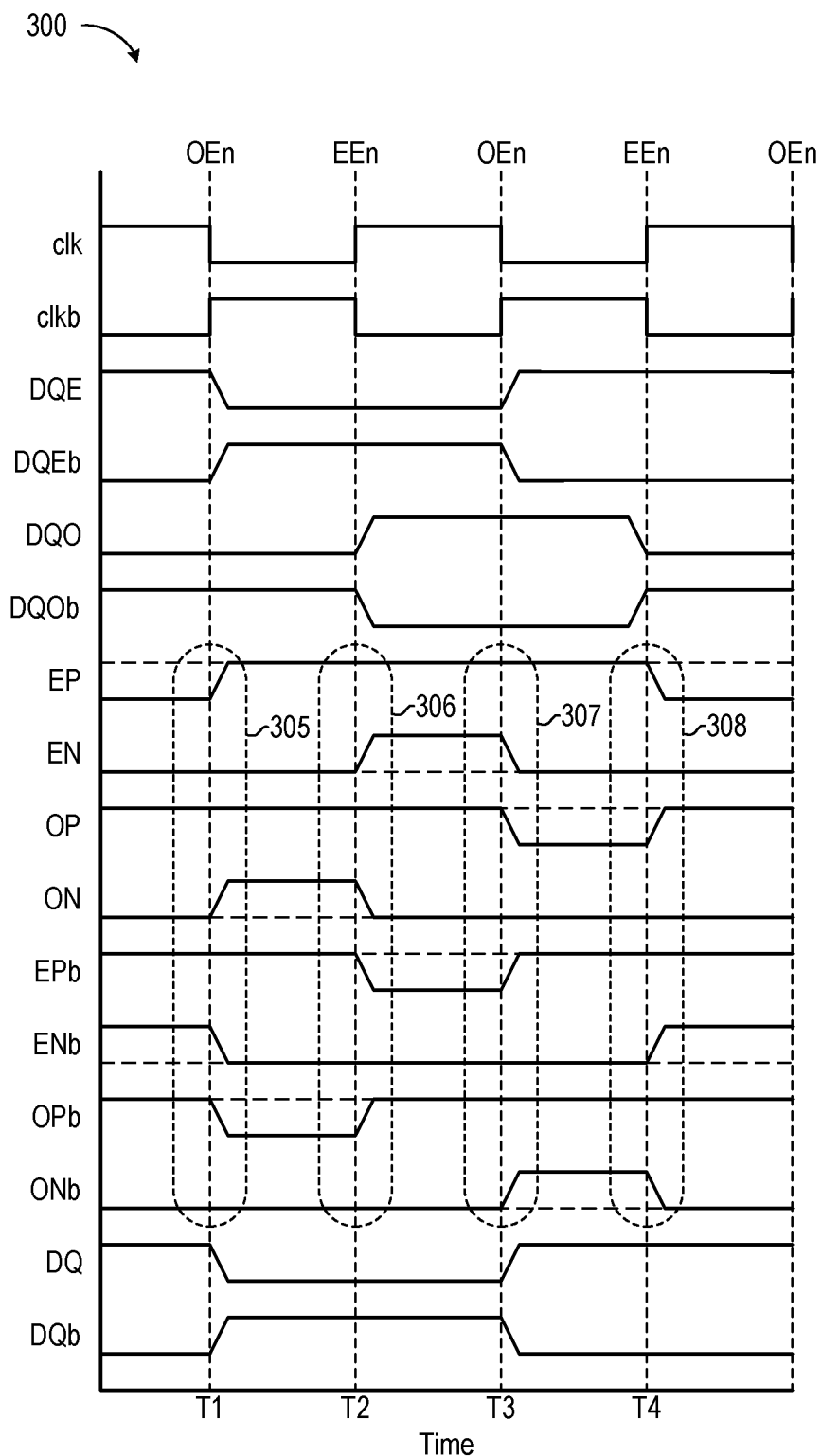
FIG. 3 is a timing diagram 300 illustrating the operation of IC 202 of FIG. 2.

FIG. 3 is a timing diagram 300 illustrating the operation of IC 202 of FIG. 2. Timing diagram 300 is similar to diagram 150 of FIG. 1 but is extended to include nodes and corresponding signals of transmitter replica 230. Signal transitions occur at times T1 to T4, which are coincident with edges of complementary clock signals clk and clkb. The currents drawn by the various circuit nodes sum to zero. Consider the eight pre-amplifier nodes EP, EN, OP, ON, EPb, ENb, OPb, and ONb; at each of times T1-T4, two of these nodes charge the source-gate capacitance of a respective transistor, two discharge the source-gate capacitance of a respective transistor, and four remain unchanged. Bounding lines 305-308 encompass representative sets of transitions. Taking the rightmost bounding line 308, for example, signals EP and ENb charge their respective capacitances, signals OP and ONb discharge their respective capacitances, and signals EN, ON, EPb, and OPb remain unchanged. The remaining clock and data signals, all complementary, are likewise balanced. The sum of supply currents and concomitant switching noise at time T4 is thus minimized irrespective of the transmitted data pattern.

Figure 4:
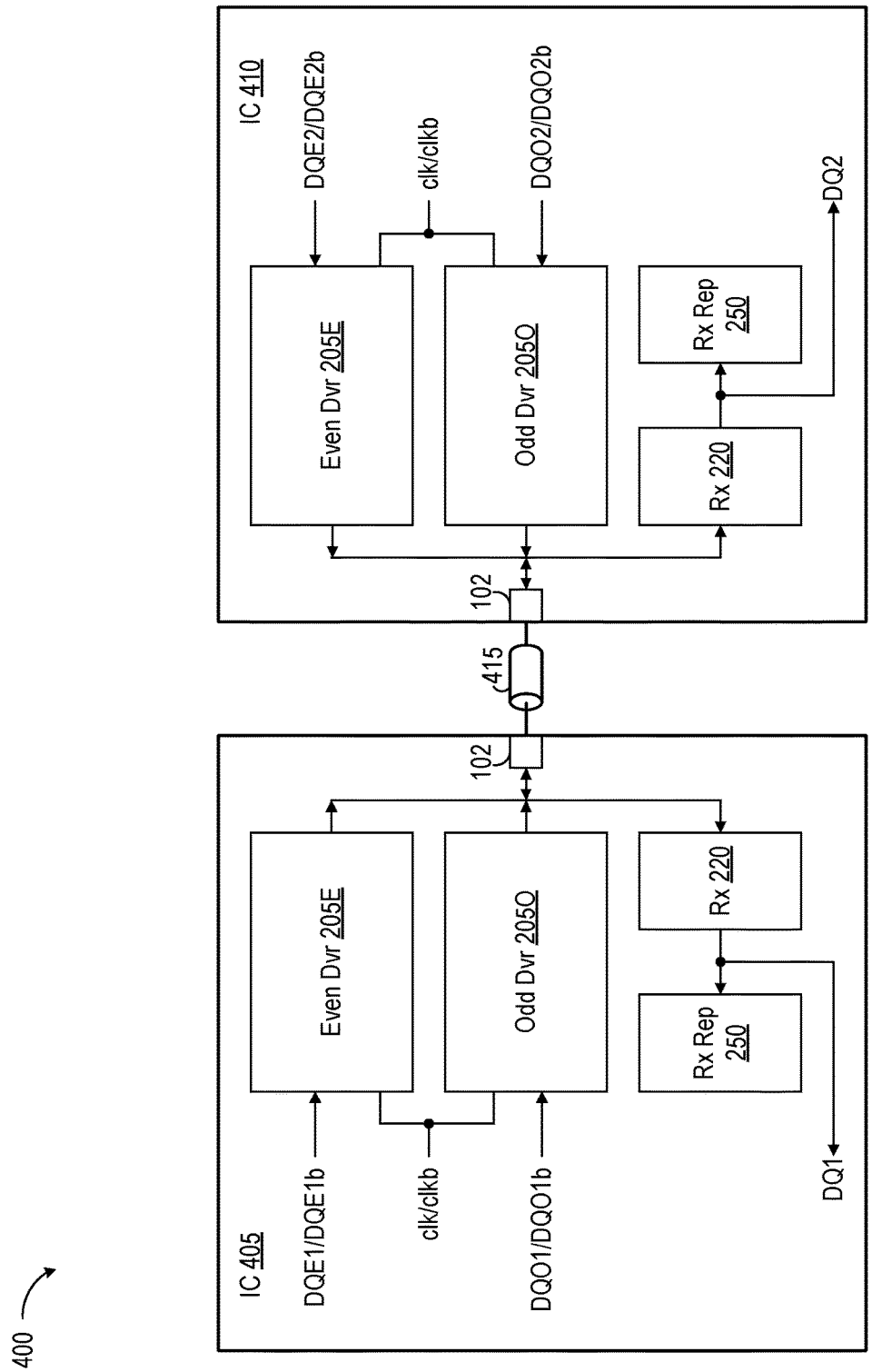
FIG. 4 depicts a communication system 400 in which first and second ICs 405 and 410 communicate bidirectionally over a channel 410 using transmitters and receivers that employ replica circuits in the manner detailed above in connection with FIGS. 2 and 3.

FIG. 4 depicts a communication system 400 in which first and second ICs 405 and 410 communicate bidirectionally over a channel 415 using transmitters and receivers that employ predrivers and replica circuits in the manner detailed above in connection with FIGS. 2 and 3, like-identified elements being the same or similar. IC 405 employs even and odd drivers 205E and 205O to drive complementary even and odd data signals DQE1/EQE1b and DQO1/DQO1b over channel 415 via a pad 102 that serves as a bidirectional communication node. IC 405 employs a receiver 220 to recover a data signal DQ1 from IC 410 via the same pad 102. IC 410 employs identical transmit and receive circuitry to transmit complementary even and odd data signals DQE2/EQE2b and DQO2/DQO2b and receive a data signal DQ2 from IC 405.

ICs 405 and 410 support a single channel 415 but can likewise support more, either as additional serial links or to support one or more parallel interfaces. Serial or parallel interfaces can be used to communicate with and between various types of ICs and systems, including e.g. memories, memory buffers, systems on chips (SoCs), processors, and controllers. An output of a process for designing an IC or a portion of an IC comprising one or more of the circuits described herein may be a computer-readable medium. The computer-readable medium may be encoded with data structures or other information describing circuitry that may be physically instantiated as an IC. Various formats may be used for such encoding. Those of skill in the art of IC design can develop such data structures from schematic diagrams of the type detailed above and the corresponding descriptions and encode the data structures on computer-readable medium. Those of skill in the art of IC fabrication can use such encoded data to fabricate ICs comprising one or more of the circuits described herein.

While the subject matter has been described in connection with specific embodiments, other embodiments are also envisioned. For example, the foregoing embodiments can be expanded to include additional drivers to serialize more than two data streams, can be extended to convey multi-level signals (e.g. PAM-4 signals), and can be extended to convey signals in two directions (e.g., back and forth between ICs) via the same or different channels. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A transmitter for driving a serialized signal on an output node, the transmitter comprising:
   a plurality of drivers, each driver having:
      a pull-up transistor having a first current-handling terminal coupled to a high supply node, a second current-handling terminal coupled to the output node, and a pull-up control terminal, the pull-up transistor exhibiting a pull-up capacitance between the high supply node and the pull-up control terminal;
      a pull-down transistor having a first current-handling terminal coupled to a low supply node, a second current-handling terminal coupled to the output node, and a control terminal, the pull-down transistor exhibiting a pull-down capacitance between the low supply node and the pull-down control terminal; and
      a pre-driver having an input node to receive an input signal expressing a series of symbols, a first pre-driver output coupled to the pull-up control terminal, a second pre-driver output coupled to the pull-down control terminal, and a timing input to receive at least one timing signal;
      wherein the at least one timing signal periodically controls the pre-driver of a first of the plurality of drivers to discharge one of the pull-up capacitance and the pull-down capacitance of the first of the plurality of drivers while simultaneously controlling the pre-driver of a second of the plurality of drivers to charge one of the pull-up capacitance and the pull-down capacitance of the second of the plurality of drivers.

2. The transmitter of claim 1, wherein the drivers include an even-data driver and an odd-data driver.

3. The transmitter of claim 1, the at least one timing signal including a clock signal and an inverted-clock signal complementary to the clock signal.

4. The transmitter of claim 3, the pre-driver of the first of the plurality of drivers timing the charge of the pull-up capacitance to edges of the clock signal and timing the charge of the pull-down capacitance to edges of the inverted-clock signal.

5. The transmitter of claim 4, the pre-driver of the second of the plurality of drivers timing the charge of the pull-up capacitance to edges of the inverted-clock signal and timing the charge of the pull-down capacitance to edges of the clock signal.

6. The transmitter of claim 1, wherein at least one of the pull-up transistor and the pull-down transistor is a field-effect transistor.

7. The transmitter of claim 1, wherein the high supply node supplies a positive supply voltage and the low supply node supplies a negative supply voltage.

8. The transmitter of claim 1, wherein charging one of the pull-up capacitance and the pull-down capacitance of the second of the plurality of drivers drives the input signal onto the output node, the transmitter further comprising, for each driver:
   a replica load; and
   a replica driver to drive a complement of the input signal into the replica load.

9. The transmitter of claim 8, the replica driver comprising:
   a pull-up transistor having a first current-handling terminal coupled to the high supply node, a second current-handling terminal coupled to the replica load, and a pull-up control terminal, the pull-up transistor exhibiting the pull-up capacitance between the high supply node and the pull-up control terminal;
   a pull-down transistor having a first current-handling terminal coupled to the low supply node, a second current-handling terminal coupled to the replica load, and a control terminal, the pull-down transistor exhibiting the pull-down capacitance between the low supply node and the pull-down control terminal; and
   a pre-driver having an input node to receive the complement of the input signal, a first pre-driver output coupled to the pull-up control terminal, a second pre-driver output coupled to the pull-down control terminal, and a timing input to receive the at least one timing signal.

10. The transmitter of claim 9, wherein the at least one timing signal periodically controls the pre-driver of the replica driver to discharge one of the pull-up capacitance and the pull-down capacitance.

11. A method for driving alternative symbols as a serialized signal onto an output node using alternative drivers, each of the alternative drivers including a pull-up transistor coupled between a high supply node and the output node and a pull-down transistor coupled between a low supply node and the output node, the method comprising:
   charging a gate-source capacitance of one of the pull-up transistor and the pull-down transistor in a first of the alternative drivers responsive to a first of the symbols and a timing signal; and
   discharging a gate-source capacitance of one of the pull-up transistor and the pull-down transistor in a second of the alternative drivers responsive to the timing signal.

12. The method of claim 11, wherein the timing signal comprises simultaneous edges of complementary clock signals.

13. The method of claim 11, further comprising:
   holding in discharge a gate-source capacitance of the other one of the pull-up transistor and the pull-down transistor in the first of the alternative drivers responsive to the first of the symbols and the timing signal; and
   holding in discharge a gate-source capacitance of the other one of the pull-up transistor and the pull-down transistor in the second of the alternative drivers responsive to the timing signal.

14. The method of claim 11, wherein the alternative drivers consist of the first of the alternative drivers and the second of the alternative drivers.

15. The method of claim 11, each of the alternative drivers including a second pull-up transistor coupled between the high supply node and a replica node and a pull-down transistor coupled between the low supply node and the replica node, the method comprising:
   charging a gate-source capacitance of one of the second pull-up transistor and the second pull-down transistor in the first of the alternative drivers responsive to the first of the symbols and the timing signal; and
   discharging a gate-source capacitance of one of the second pull-up transistor and the second pull-down transistor in the second of the alternative drivers responsive to the timing signal.

16. The method of claim 15, wherein:

charging the gate-source capacitance of the one of the pull-up transistor and the pull-down transistor in the first of the alternative drivers responsive to the first of the symbols and the timing signal turns on the one of the pull-up transistor and the pull-down transistor in the first of the alternative drivers to change an output voltage on the output node in a first direction; and charging the gate-source capacitance of the one of the second pull-up transistor and the second pull-down transistor in the first of the alternative drivers responsive to the first of the symbols and the timing signal turns on the one of the second pull-up transistor and the second pull-down transistor in the first of the alternative drivers to change a replica voltage on the replica node in a second direction opposite the first direction.

17. An integrated-circuit (IC) for driving a serialized signal on communication node, the IC comprising:

a plurality of drivers, each driver having:
- a transistor having a first current-handling terminal coupled to a supply node, a second current-handling terminal coupled to the communication node, and a control terminal, the transistor exhibiting a capacitance between the first current-handling terminal and the control terminal; and
- a pre-driver having an input node to receive an input signal expressing a series of symbols, a first pre-driver output coupled to the control terminal, and a timing input to receive at least one timing signal;

wherein the at least one timing signal periodically controls the pre-driver of a first of the plurality of drivers to discharge the capacitance while simultaneously controlling the pre-driver of a second of the plurality of drivers to charge the capacitance.

18. The IC of claim 17, wherein the drivers include an even-data driver and an odd-data driver.

19. The IC of claim 17, the at least one timing signal including a clock signal and an inverted-clock signal complementary to the clock signal.

20. The IC of claim 17, wherein the control terminal comprises a gate of the transistor.

21. The IC of claim 17, further comprising:

a receiver having:
- a first impedance; and
- an amplifier coupled to the communication node to receive a second signal and coupled, via the first impedance, to a supply node;

the amplifier to amplify the second signal; and a replica of the receiver coupled to the amplifier and including a second impedance matched to the first impedance, the replica of the receiver to invert the amplified second signal and drive the second impedance with the inverted amplified second signal.

22. The IC of claim 17, wherein the first impedance is coupled between the communication node and the supply node.

* * * * *